(12) United States Patent
Fu

(10) Patent No.: US 10,985,205 B2
(45) Date of Patent: Apr. 20, 2021

(54) DISPLAY PANEL AND METHOD FOR MANUFACTURING DISPLAY PANEL

(71) Applicant: SHANGHAI TIANMA MICRO-ELECTRONICS CO., LTD., Shanghai (CN)

(72) Inventor: Jujian Fu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/252,709

(22) Filed: Jan. 21, 2019

(65) Prior Publication Data
US 2019/0165035 A1  May 30, 2019

(30) Foreign Application Priority Data

Sep. 20, 2018  (CN) .......................... 201811118581.3

(51) Int. Cl.
*G06F 3/041* (2006.01)
*G09G 3/32* (2016.01)
(Continued)

(52) U.S. Cl.
CPC ............ *H01L 27/15* (2013.01); *H01L 25/167* (2013.01); *H01L 27/156* (2013.01); *H01L 33/12* (2013.01); *H01L 33/62* (2013.01)

(58) Field of Classification Search
CPC ............... H05K 1/181; H05K 3/284; H05K 2201/09709; H05K 2201/10106;
(Continued)

(56) References Cited

U.S. PATENT DOCUMENTS 9,343,448 B2    5/2016  Sakariya et al.
2012/0267638 A1* 10/2012 Lee ................... H01L 21/02458
                                           257/76
(Continued)

FOREIGN PATENT DOCUMENTS

CN        102427080 A    4/2012
CN        205863169 U    1/2017
(Continued)

OTHER PUBLICATIONS

Office Action of Chinese Patent Application No. 201811118581.3 dated Mar. 4, 2020.

*Primary Examiner* — Brian Turner
(74) *Attorney, Agent, or Firm* — Kilpatrick Townsend & Stockton, LLP

(57) ABSTRACT

A display panel and a method for manufacturing the display panel are provided. The method includes providing a first substrate, forming a buffer layer including at least one first buffer layer on a first side of the first substrate; forming a LED structure including a first LED structure on a side of the buffer layer facing away from the first substrate, forming a planarization layer covering the LED structure on a side of the LED structure facing away from the buffer layer, forming an electrode structure connected to the LED units on a side of the planarization layer facing away from the LED structure, and forming a control circuit on a side of the electrode structure facing away from the LED structure, where the control circuit is electrically connected to the electrode structure and configured to control operation states of the LED units.

11 Claims, 13 Drawing Sheets

(51) Int. Cl.
  *H01L 27/12* (2006.01)
  *G06F 3/044* (2006.01)
  *H01L 27/15* (2006.01)
  *H01L 33/12* (2010.01)
  *H01L 25/16* (2006.01)
  *H01L 33/62* (2010.01)

(58) Field of Classification Search
  CPC . H05K 2201/1031; H05K 2201/10515; H05K 2201/10674; H05K 2201/10893; H05K 2203/1322; H05K 1/0203; H01L 24/19; H01L 25/167; H01L 2224/73265; Y02P 70/611
  See application file for complete search history.

(56) References Cited

U.S. PATENT DOCUMENTS

| | | | | |
|---|---|---|---|---|
| 2014/0191277 A1* | 7/2014 | Chen | ................... | H01L 33/38 257/99 |
| 2014/0367633 A1* | 12/2014 | Bibl | ................... | H01L 25/0753 257/13 |
| 2016/0033823 A1* | 2/2016 | Lee | ................... | G02F 1/133617 349/71 |
| 2017/0309773 A1* | 10/2017 | Hsieh | ................... | H01L 33/32 |
| 2017/0358624 A1* | 12/2017 | Takeya | ................... | H01L 25/167 |
| 2018/0190712 A1 | 7/2018 | Xu et al. | | |
| 2018/0261583 A1 | 9/2018 | Chang et al. | | |
| 2019/0198735 A1* | 6/2019 | Tsai | ................... | H01L 27/1214 |
| 2019/0385991 A1* | 12/2019 | Kim | ................... | H01L 27/15 |

FOREIGN PATENT DOCUMENTS

| | | |
|---|---|---|
| CN | 106449661 A | 2/2017 |
| CN | 106784224 A | 5/2017 |
| CN | 106876406 A | 6/2017 |
| CN | 107424524 A | 12/2017 |
| CN | 108288661 A | 7/2018 |

* cited by examiner

DISPLAY PANEL AND METHOD FOR MANUFACTURING DISPLAY PANEL

CROSS REFERENCE OF RELATED APPLICATION

This application claims the priority to Chinese Patent Application No. 201811118581.3, titled "DISPLAY PANEL AND METHOD FOR MANUFACTURING DISPLAY PANEL", filed on Sep. 20, 2018 with the Chinese Patent Office, which is incorporated herein by reference in its entirety.

FIELD

The present disclosure relates to the field of display, and in particular to a display panel and a method for manufacturing the display panel.

BACKGROUND

A Light Emitting Diode (LED) has advantages of self-luminescent, small size, light weight, high brightness, long service life, low power consumption, short response time and strong controllability. A Micro-Light Emitting Diode (Micro-LED) has a LED structure designed with being thinned, miniaturized and arrayed, and a size of the Micro-LED is only from 1 um to 100 um. The Micro LED gradually becomes a mainstream development trend of display panels due to its advantages of higher brightness, better light emitting efficiency and lower power consumption than a conventional Organic Light-Emitting Diode (OLED).

During a manufacturing process of a Micro LED display panel in the conventional art, an array substrate and a Micro LED structure are usually manufactured separately, and the Micro LED structure is transported to the array substrate, thereby greatly increasing the complexity of the manufacturing process of the Micro LED display panel.

SUMMARY

A display panel and a method for manufacturing the display panel are provided according to an embodiment of the present disclosure so as to decrease the complexity of a manufacturing process of the display panel.

A method for manufacturing a display panel is provided, which includes: providing a first substrate, where the first substrate is a glass substrate; forming a buffer layer on a first side of the first substrate, where the buffer layer includes at least one first buffer layer; forming a Light Emitting Diode (LED) structure on a side of the buffer layer facing away from the first substrate, where the LED structure includes a first LED structure, the first LED structure includes multiple LED units, where the first buffer layer is lattice-matched with the first LED structure; forming a planarization layer covering the LED structure on a side of the LED structure facing away from the buffer layer; forming an electrode structure on a side of the planarization layer facing away from the LED structure, where the electrode structure is electrically connected to the LED units; and forming a control circuit on a side of the electrode structure facing away from the LED structure, where the control circuit is electrically connected to the electrode structure and is configured to control operation states of the LED units.

A display panel is provided, which includes a first substrate, a buffer layer, a Light Emitting Diode (LED) structure, a planarization layer, an electrode structure and a control circuit. The first substrate is a glass substrate. The buffer layer is located on a first side of the first substrate. The buffer layer includes at least one first buffer layer. The LED structure is located on a side of the buffer layer facing away from the first substrate. The LED structure includes a first LED structure. The first LED structure includes multiple LED units. The first buffer layer is lattice-matched with the first LED structure. The planarization layer covers the LED structure and is located on a side of the LED structure facing away from the buffer layer. The electrode structure is located on a side of the planarization layer facing away from the LED structure. The electrode structure is electrically connected to the LED units. The control circuit is located on a side of the electrode structure facing away from the LED structure. The control circuit is electrically connected to the electrode structure and is configured to control operation states of the LED units.

In the method for manufacturing the display panel according to the embodiment of the present disclosure, the display panel is formed by sequentially forming the buffer layer and the LED structure on a side of the first substrate without a transport process, thereby decreasing the complexity of the manufacturing process of the display panel.

In addition, the transport process is not required in the method for manufacturing the display panel according to the embodiment of the present disclosure, in this way, it is not required a high-precision alignment device for ensuring that the LED structure is strictly aligned with an opening region on the array substrate in the transport process, which decreases a cost of the display panel and avoids damage to the LED structure during the transport process, thereby solving a problem of possible failure of the LED structure due to the transport process.

In addition, in the method for manufacturing the display panel according to the embodiment of the present disclosure, the LED structure is first manufactured, then the electrode structure electrically connected to the LED structure and the control circuit electrically connected to the electrode structure are directly manufactured on the side of the LED structure facing away from the first substrate without a high-temperature bonding process, thereby preventing operation characteristics of a thin film transistor in the control circuit from varying due to influence of a high temperature.

BRIEF DESCRIPTION OF THE DRAWINGS

The drawings to be used in the description of the embodiments of the disclosure will be described briefly as follows, so that the embodiments of the present disclosure will become clearer. It is apparent that the drawings in the following description only illustrate some embodiments of the present disclosure.

DETAILED DESCRIPTION

Embodiments of the present disclosure are described in conjunction with the drawings hereinafter. It is apparent that the described embodiments are only a few rather than all of the embodiments according to the present disclosure. Any other embodiments obtained by those skilled in the art based on the embodiments in the present disclosure without any creative work fall into the scope of the present disclosure.

In the following detailed description, numerous specific details are set forth to provide a thorough understanding of the present disclosure. However the present disclosure may also be implemented in other manners different from what is described herein. Those skilled in the art will understand that similar popularization can be made to the specific embodiments without departing from the essence of the present disclosure. Hence the present disclosure is not limited to the embodiments disclosed herein.

As described in the background, during a manufacturing process of a Micro LED display panel in the conventional art, an array substrate and a Micro LED structure are usually manufactured separately, and the Micro LED structure is transported to the array substrate, thereby greatly increasing the complexity of the manufacturing process of the Micro LED display panel.

Also, in a process of transporting the Micro LED structure to the array substrate, it is required that Micro LEDs are strictly aligned to the opening region on the array substrate so as to ensure an aperture ratio of the Micro LED display panel. High precision is required, therefore the high-precision alignment device is required, resulting in a high cost of the Micro LED display panel.

In addition, in a process of transporting the Micro LED structure to the array substrate, it is required to use a high temperature (about 300 degrees Celsius) process to achieve electrical connection between the Micro LED structure and anodes on the array substrate, however the high temperature process may influence the operation characteristics of the thin film transistor in the array substrate.

Figure 1:
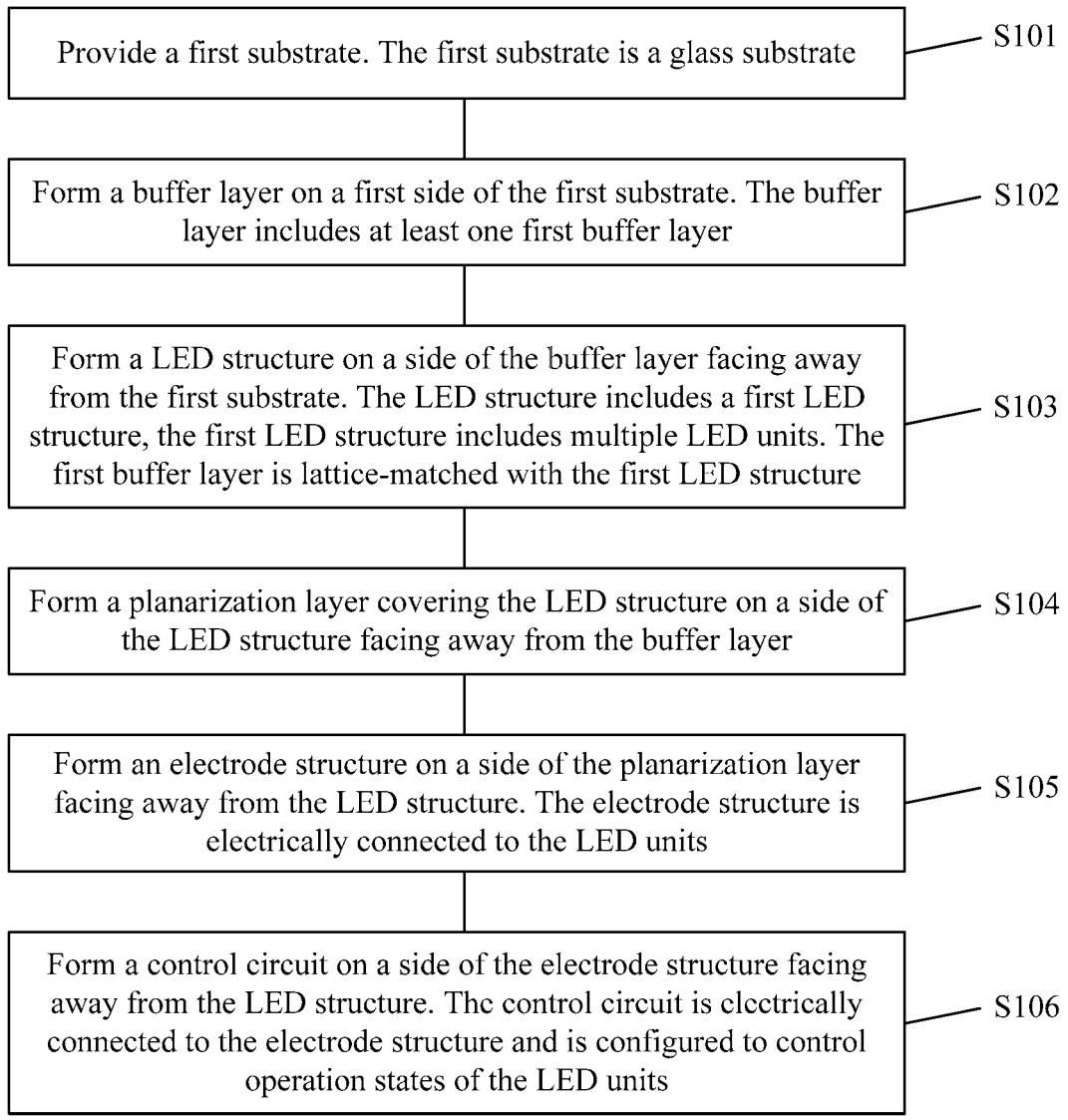
FIG. 1 is a flowchart of a method for manufacturing a display panel according to an embodiment of the present disclosure.

In view of this, a method for manufacturing a display panel is provided according to the embodiment of the present disclosure. As shown in FIG. 1, the method includes steps S101 to S106.

Figure 2:
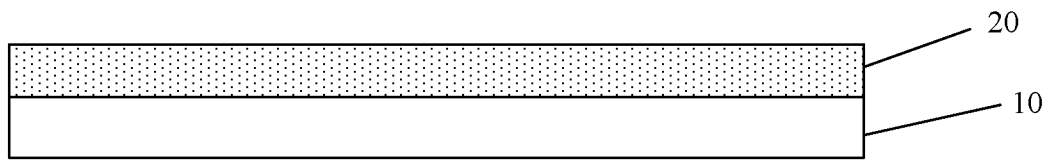
FIGS. 2 to 25 are sectional views showing stages of a method for manufacturing a display panel according to embodiments of the present disclosure.

In step S101, as shown in FIG. 2, a first substrate 10 is provided. The first substrate 10 is a glass substrate.

In one embodiment, in an embodiment of the present disclosure, the first substrate 10 is a high temperature resistant transparent substrate. A temperature can be withstood by the high temperature resistant glass substrate is more than 1000 degrees Celsius, so that the first substrate 10 is not damaged in a subsequent process of growing the LED structure at a high temperature.

In step S102, as shown in FIG. 2, a buffer layer 20 is formed on a first side of the first substrate 10. The buffer layer 20 includes at least one first buffer layer. In one embodiment, the buffer layer 20 may be formed by an evaporation process, a Chemical Vapour Deposition (CVD) process or a PHOTO process, which is not limited in the present disclosure and depends on specific requirements.

In an embodiment of the present disclosure, the buffer layer 20 includes one first buffer layer. In another embodiment of the present disclosure, the buffer layer 20 includes at least two first buffer layers, which is not limited in the present disclosure and depends on specific requirements.

In step S103, a LED structure is formed on a side of the buffer layer 20 facing away from the first substrate 10. The LED structure includes a first LED structure, the first LED structure includes multiple LED units. The first buffer layer is lattice-matched with the first LED structure.

Figure 3:
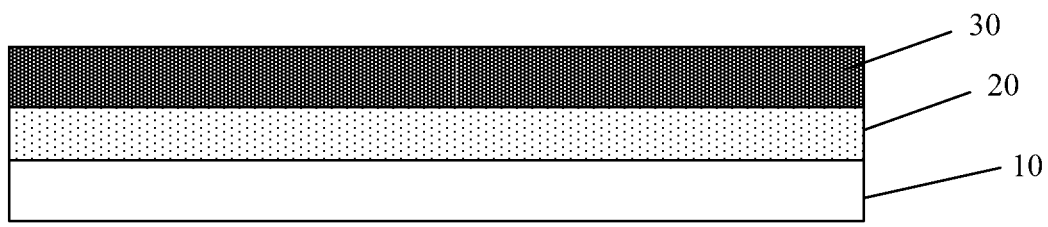
Figure 4:
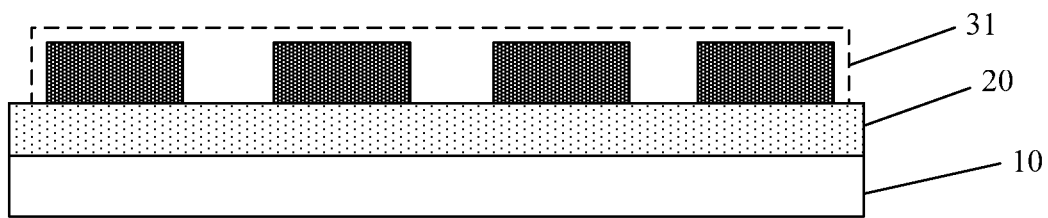

In an embodiment of the present disclosure, a process of forming a LED structure on a side of the buffer layer facing away from the first substrate 10 with the LED structure including a first LED structure and the first LED structure including multiple LED units includes: as shown in FIG. 3, forming a LED layer 30 on a side of the buffer layer 20 facing away from the first substrate 10; and as shown in FIG. 4, etching the LED layer 30 to form first LED structure 31 which includes multiple LED units.

Figure 5:
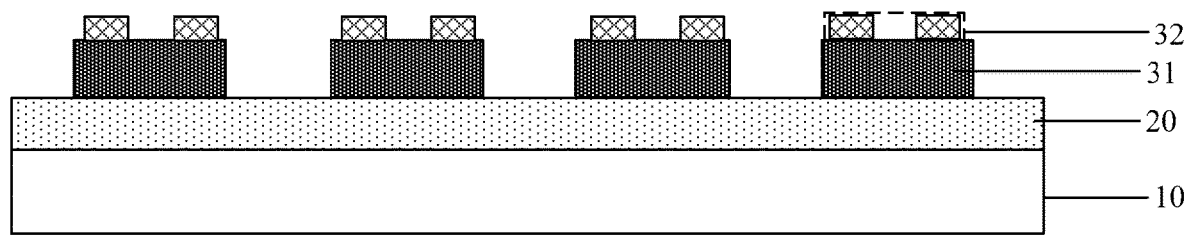

Based on the embodiments described above, in an embodiment of the present disclosure, as shown in FIG. 5, a process of forming a LED structure on a side of the buffer layer 20 facing away from the first substrate 10 with the LED structure including a first LED structure 31 and the first LED structure 31 including multiple LED units includes: forming an electrode layer on a side of the multiple LED units facing away from the first substrate 10; and performing patterned etching on the electrode layer to form multiple groups of connection terminals 32 respectively corresponding to the multiple LED units on a side of the multiple LED units facing away from the first substrate 10. One group of the connection terminals 32 corresponds to one LED unit. Each group of the connection terminals includes a first terminal and a second terminal electrically connected to the LED unit, such that the LED unit is electrically connected to other structures via the first terminal and the second terminal corresponding to the LED unit.

Based on the embodiments described above, in an embodiment of the present disclosure, the first terminal is a positive electrode terminal, and the second terminal is a negative electrode terminal. In another embodiment of the present disclosure, the first terminal is a negative electrode terminal, and the second terminal is a positive electrode terminal, which is not limited in the present disclosure and depends on specific requirements.

Figure 6:
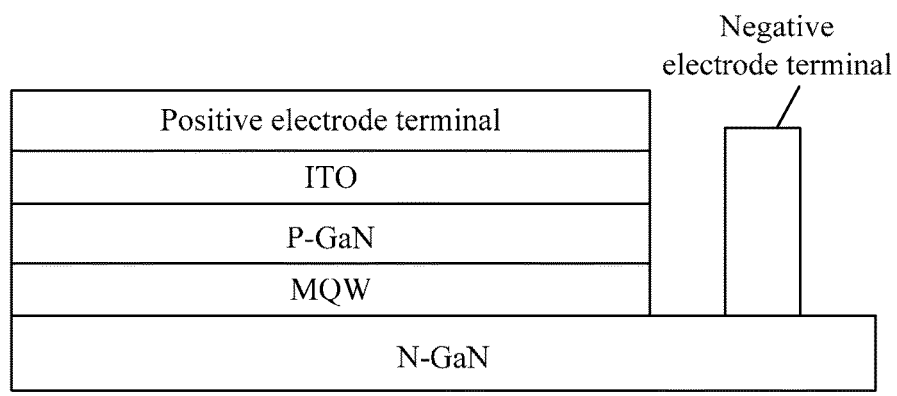

As shown in FIG. 6, FIG. 6 shows a sectional view of a first LED structure according to an embodiment of the present disclosure. In the embodiment of the present disclosure, the first LED structure includes multiple LED units and connection terminals electrically connected to the LED units. In one embodiment, each of the LED units includes a light emitting layer MQW, a P-type layer P-GaN located on a first side of the light emitting layer, an ohmic contact layer ITO located on a side of the P-type layer facing away from the light emitting layer and a N-type layer N-GaN located on a second side of the light emitting layer. The second side and the first side are opposite to each other. The connection terminals include a positive electrode terminal located on a side of the ohmic contact layer facing away from the light emitting layer and electrically connected to the ohmic contact layer and a negative electrode terminal electrically connected to the N-type layer.

In one embodiment, based on the embodiments described above, in an embodiment of the present disclosure, the LED structure is a Micro LED structure, which is not limited in the present disclosure and depends on specific requirements.

Based on the embodiments described above, in an embodiment of the present disclosure, the first buffer layer being lattice-matched with the first LED structure includes: a difference between a lattice constant of the first buffer layer and a lattice constant of the first LED structure being within a first preset numerical range, and a difference between a thermal expansion coefficient of the first buffer layer and a thermal expansion coefficient of the first LED structure being within a second preset numerical range. The first buffer layer is lattice-matched with the first LED structure, so that the first LED structure may be directly grown on the first buffer layer.

In one embodiment, in an embodiment of the present disclosure, the first preset numerical range is 0-10%, the second preset numerical range is 0-10%. That is, the first buffer layer being lattice-matched with the first LED structure 31 includes: the difference between the lattice constant of the first buffer layer and the lattice constant of the first LED structure 31 ranging from 0 to 10%; and the difference between the thermal expansion coefficient of the first buffer layer and the thermal expansion coefficient of the first LED structures 31 ranging from 0 to 10%, which are not limited in the present disclosure. In other embodiments of the present disclosure, the first preset numerical range and/or the second preset numerical range may also be other numerical ranges, and the first preset numerical range and the second preset numerical range may be the same or different from each other, which is not limited in the present disclosure and depends on specific requirements.

Figure 7:
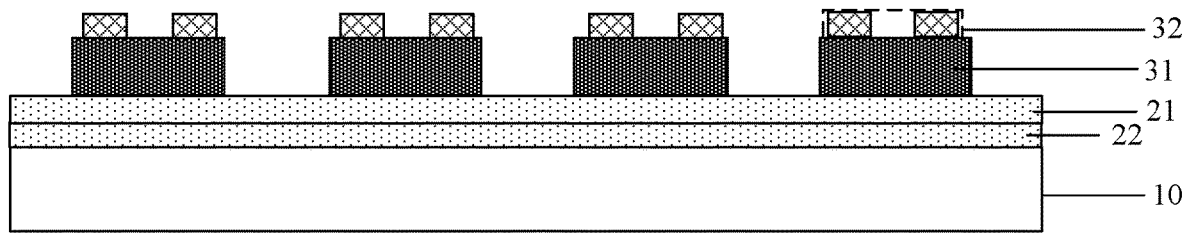

Based on the embodiments described above, in an embodiment of the present disclosure, as shown in FIG. 7, the buffer layer further includes a fourth buffer layer 22 located between a film layer where the first substrate 10 is located and a film layer where the first buffer layer 21 is located. A lattice constant of the fourth buffer layer 22 ranges from the lattice constant of the first buffer layer 21 to a lattice constant of the first substrate 10. A thermal expansion coefficient of the fourth buffer layer 22 ranges from the thermal expansion coefficient of the first buffer layer 21 to a thermal expansion coefficient of the first substrate 10. In this way, transition between the lattice constant of the first buffer layer 21 and the lattice constant of the first substrate 10 is realized by using the lattice constant of the fourth buffer layer 22, and transition between the thermal expansion coefficient of the first buffer layer 21 and the thermal expansion coefficient of the first substrate 10 is realized by using the thermal expansion coefficient of the fourth buffer layer 22. In this case, the quality of the buffer layer is improved, and the quality of the LED structure grown on the buffer layer is improved.

Based on the embodiments described above, in an embodiment of the present disclosure, the buffer layer includes one first buffer layer 21 and one fourth buffer layer 22. In the embodiment of the present disclosure, the forming a buffer layer on a first side of the first substrate 10 includes: forming the fourth buffer layer 22 on the first side of the first substrate 10; and forming the first buffer layer 21 on a side of the fourth buffer layer 22 facing away from the first substrate 10.

In another embodiment of the present disclosure, the buffer layer includes at least two first buffer layers 21 and at least two fourth buffer layers 22. In the embodiment of the present disclosure, the forming a buffer layer on a first side of the first substrate 10 includes: forming the fourth buffer layer 22 and the first buffer layer 21 on the first side of the first substrate 10 in an alternate manner until the buffer layer includes at least two first buffer layers 21 and at least two fourth buffer layers 22. A film layer of the buffer layer that is in contact with the first substrate is the fourth buffer layer; a film layer of the buffer layer that is in contact with the LED structure is the first buffer layer. It should be noted that the number of the first buffer layers and the number of the fourth buffer layers included in the buffer layer are not limited in the present disclosure and depend on specific requirements.

Figure 8:
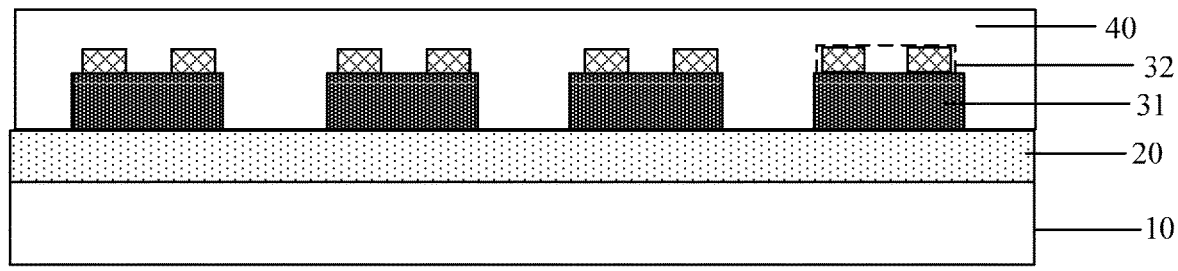

In step S104, as shown in FIG. 8, a planarization layer 40 covering the LED structure is formed on a side of the LED structure facing away from the buffer layer 20. In one embodiment, the planarization layer 40 may be formed by a deposition process, and the planarization layer 40 is an insulating layer.

In one embodiment of the present disclosure, the planarization layer 40 covers the LED structure such that the LED structure is insulated from other structures, and the planarization layer 40 may also be used to fix the LED structure to prevent a position of the LED structure or an arrangement manner of the LED structure from changing due to subsequent processes. In another embodiment, a flat surface is formed on a side of the LED structure facing away from the first substrate such that an electrode structure is formed on the side of the LED structure facing away from the first substrate, which decreases the complexity of forming the electrode structure.

In step S105, an electrode structure is formed on a side of the planarization layer 40 facing away from the LED structure, the electrode structures is electrically connected to the LED units. In one embodiment, the electrode structure includes first electrodes electrically connected to the first terminals and second electrodes electrically connected to the second terminals.

It should be noted that the first electrodes are anode units and the second electrodes are cathode units in a case that the first terminals are positive electrode terminals and the second terminals are negative electrode terminals; the first electrodes are cathode units and the second electrodes are anode units in a case that the first terminals are negative electrode terminals and the second terminals are positive electrode terminals.

Based on the embodiments described above, in an embodiment of the present disclosure, the first electrode and the second electrode are arranged in the same layer and are insulated from each other so as to simplify a forming process of the electrode structure, thereby simplifying the manufacturing process of the display panel, which is not limited herein. In other embodiments of the present disclosure, the first electrode and the second electrode may also be arranged in different layers and are insulated from each other, which depends on specific requirements.

Figure 9:
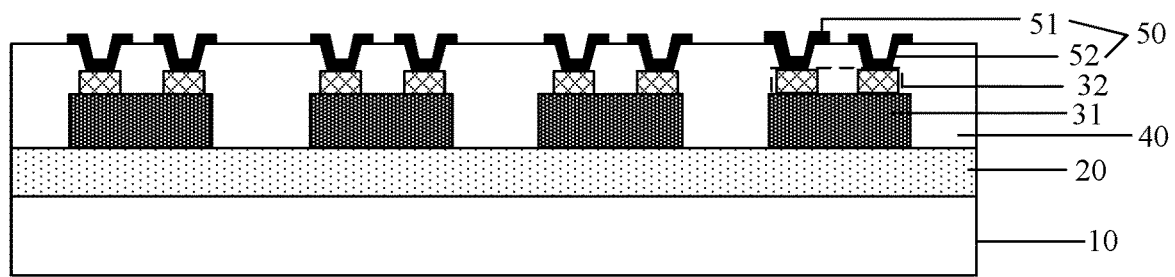

In a case that the first electrode and the second electrode are arranged in the same layer and are insulated from each other, the forming an electrode structure on a side of the planarization layer 40 facing away from the LED structure with the electrode structure being electrically connected to the LED units includes:

as shown in FIG. 9, forming an electrode layer on the side of the planarization layer 40 facing away from the LED structure; and patterning the electrode layer to form multiple anode units 51 and multiple cathode units 52, where the multiple anode units 51 are electrically insulated from each other, and the anode units 51 are electrically insulated from the cathode units 52.

In one embodiment, in an embodiment of the present disclosure, in a case that the first electrode and the second electrode are arranged in the same layer and are insulated from each other, forming an electrode structure 50 on the side of the planarization layer 40 facing away from the LED structure with the electrode structure 50 being electrically connected to the LED units includes:

etching the planarization layer 40 to form multiple groups of through holes in the planarization layer 40, where one group of the through holes corresponds to one LED unit, and each group of the through holes includes a first through hole and a second through hole;

forming an electrode layer on a side of the planarization layer 40 facing away from the first substrate 10, where the electrode layer is located on a surface of the planarization layer 40 facing away from the first substrate 10 and fills the first through holes and the second through holes; and patterning the electrode layer to form the electrode structure 50, where the electrode structure 50 includes multiple groups of the first electrodes and the second electrodes, the first electrode is electrically connected to the first terminal via the first through hole, the second electrode is electrically connected to the second terminal via the second through hole. A case that the first electrodes are anode units, and the second electrodes are cathode units is taken as an example in the following embodiments to describe manufacturing of the display panel.

Figure 10:
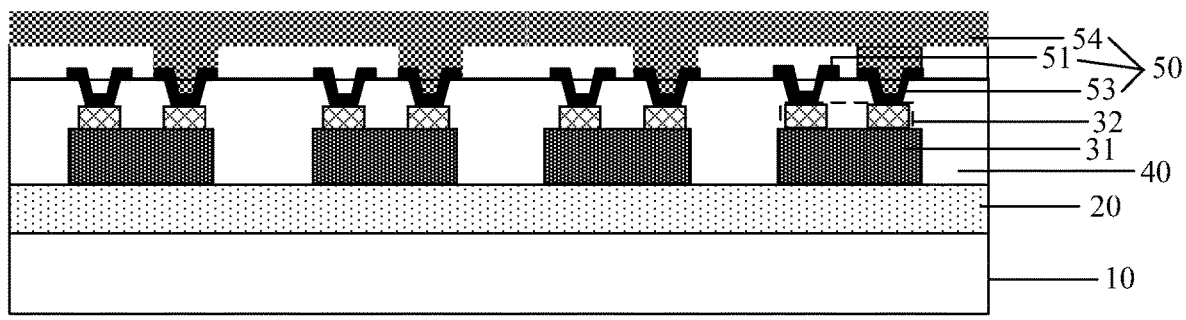

In another embodiment of the present disclosure, in a case that the first electrode and the second electrode are arranged in different layers and are insulated from each other, forming an electrode structure 50 on a side of the planarization layer 40 facing away from the LED structure with the electrode structure 50 being electrically connected to the LED units includes:

as shown in FIG. 10, forming a first electrode layer on the side of the planarization layer 40 facing away from the LED structure;

patterning the first electrode layer to form multiple anode units 51 and multiple electrical connection structures 53, where the multiple anode units 51 are electrically insulated from each other, and the anode units 51 are electrically insulated from the electrical connection structures 53, the anode unit 51 is electrically connected to the positive electrode terminal of the LED unit, and the electrical connection structure 53 is electrically connected to the negative electrode terminal of the LED unit; and forming a second electrode layer on a side of the multiple anode units and the multiple electrical connection structures facing away from the LED structure, where the second electrode layer is electrically connected to the multiple electrical connection structures 53 as a cathode layer 54 of the display panel, the cathode layer 54 and the electrical connection structures 53 form a cathode structure of the display panel.

In step S106, a control circuit is formed on a side of the electrode structure 50 facing away from the LED structure. The control circuit is electrically connected to the electrode structure 50 and is configured to control operation states of the LED units.

Figure 11:
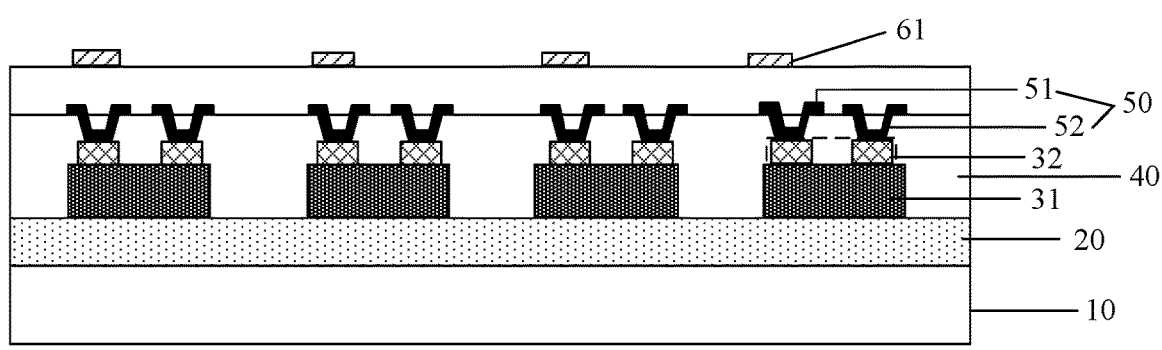
Figure 12:
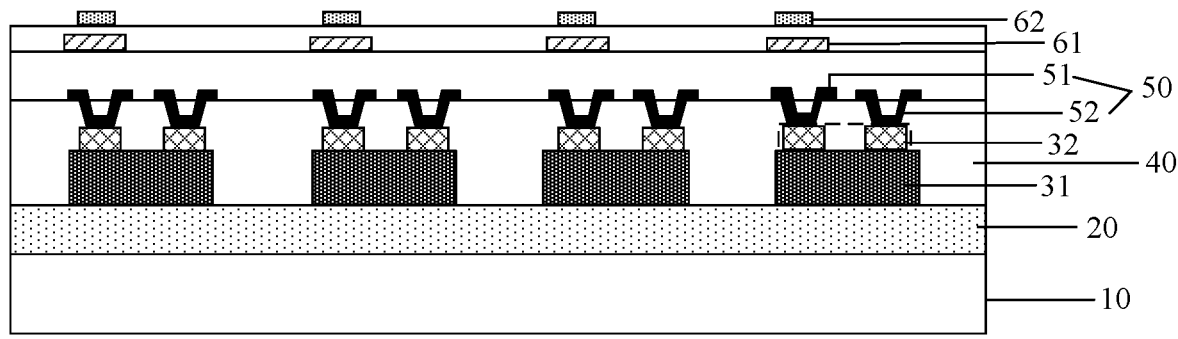
Figure 13:
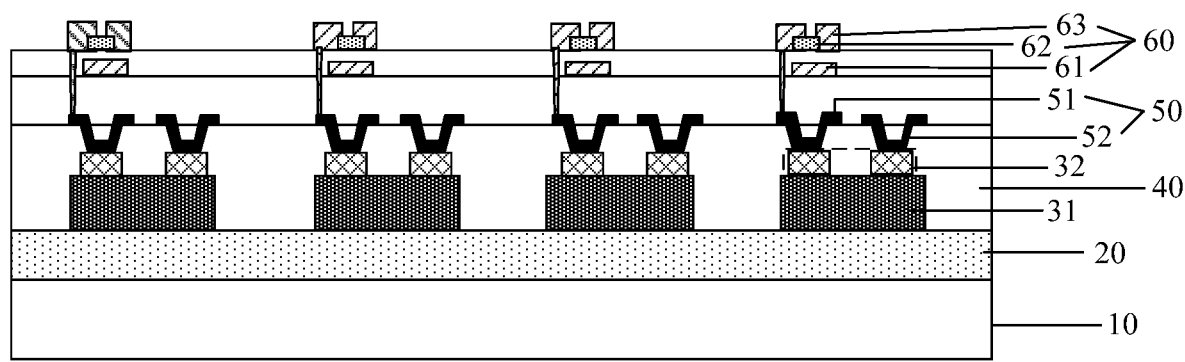

In one embodiment, in an embodiment of the present disclosure, the forming a control circuit on a side of the electrode structure 50 facing away from the LED structure includes:

as shown in FIG. 11, forming a first insulating layer on the side of the electrode structure 50 facing away from the LED structure;

forming a first metal layer on a side of the first insulating layer facing away from the electrode structure 50 and etching the first metal layer to form multiple gates 61 and multiple scanning lines (not shown in FIG. 11);

as shown in FIG. 12, forming a second insulating layer on a side of the gates 61 facing away from the electrode structure 50;

forming a channel layer on a side of the second insulating layer facing away from the electrode structure 50, and etching the channel layer to form multiple channel structures 62, the channel structures 62 corresponds to the gates 61 respectively;

as shown in FIG. 13, etching the second insulating layer to form multiple third through holes, where a part of a surface of the first electrode is exposed through the third through hole;

forming a second metal layer on a side of the channel structures 62 facing away from the electrode structure 50, where the second metal layer covers the channel structures 62 and a surface of the second insulating layer, and fills the third through holes; and etching the second metal layer to form multiple groups 63 of sources and drains and multiple data lines, where one group 63 of the source and the drain corresponds to one channel structure 62, the drain is electrically connected to the anode unit.

It should be noted that in the embodiment of the present disclosure, the gate, the source, the drain and the channel structure form a thin film transistor 60. At least one thin film transistor 60 corresponds to one LED unit. For example, the gate of the thin film transistor is electrically connected to the scanning line, the source of the thin film transistor is electrically connected to the data line, and the drain of the thin film transistor is electrically connected to the anode unit of the LED unit. In specific operation, the gate of the thin film transistor conducts the source and the drain of the thin film transistor under control of the scanning line to transmit a signal in the data line to the anode unit of the LED unit and control the operation state of the LED unit.

It should be illustrated that only one type of structure of the thin film transistor is described in the embodiments described above, which is not limited in the present disclosure. In other embodiments of the present disclosure, the thin film transistor may also have other type of structures.

Figure 14:
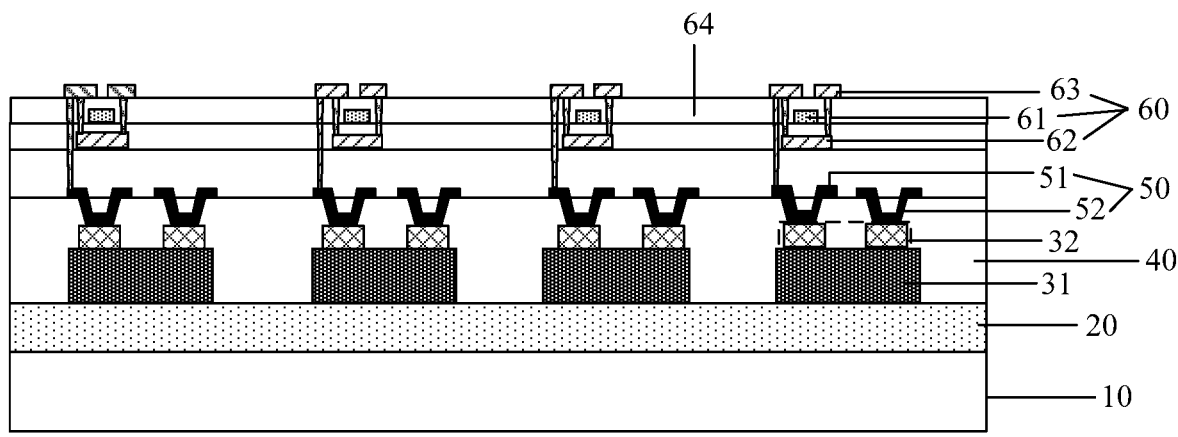

In one embodiment, as shown in FIG. 14, in another embodiment of the present disclosure, a third insulating layer 64 is further arranged between the channel structures 62 and the groups 63 of the sources and the drains. The source is electrically connected to the channel structure 62 via a through hole penetrating the third insulating layer 64, and the drain is electrically connected to the channel structure 62 via a through hole penetrating the third insulating layer 64.

Figure 15:
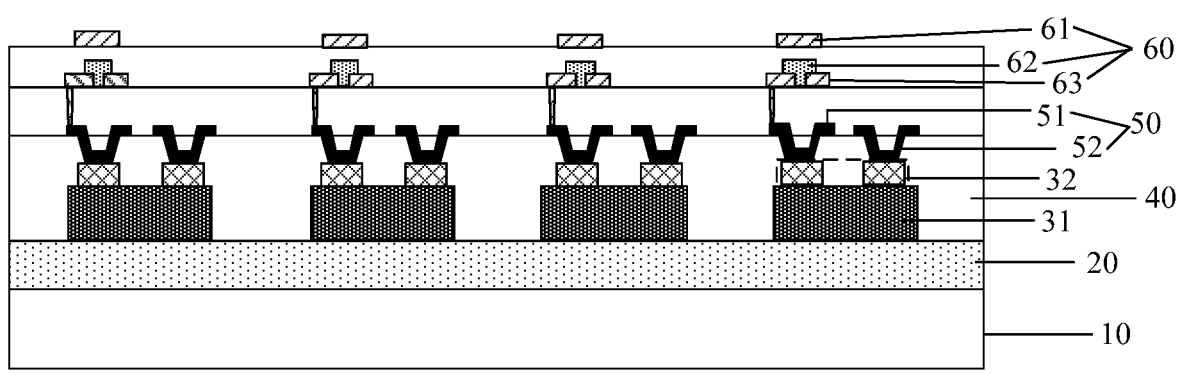

As shown in FIG. 15, in another embodiment of the present disclosure, the forming a control circuit on a side of the electrode structure 50 facing away from the LED structure includes:

forming a first insulating layer on the side of the electrode structure 50 facing away from the LED structure;

forming a first metal layer on a side of the first insulating layer facing away from the electrode structure 50, and etching the first metal layer to form multiple groups 63 of sources and drains and multiple data lines, where one group 63 of the source and the drain corresponds to one LED unit, the drain is electrically connected to the anode unit of the LED unit corresponding to the drain;

forming a channel layer on a side of the groups 63 of the sources and the drains facing away from the electrode structure 50, and etching the channel layer to form multiple channel structures 62, where one channel structure 62 corresponds to one group 63 of the source and the drain;

forming a gate dielectric layer covering the channel structures, the sources and the drains on a side of the channel structures 62 facing away from the first insulating layer; and forming a second metal layer on a side of the gate dielectric layer facing away from the channel structures 62, and etching the second metal layer to form multiple gates 61.

In the embodiment of the present disclosure, a distance between the drain and the LED structure is small, thereby being conducive to electrical connection between the drain and the anode unit of the LED unit.

Figure 16:
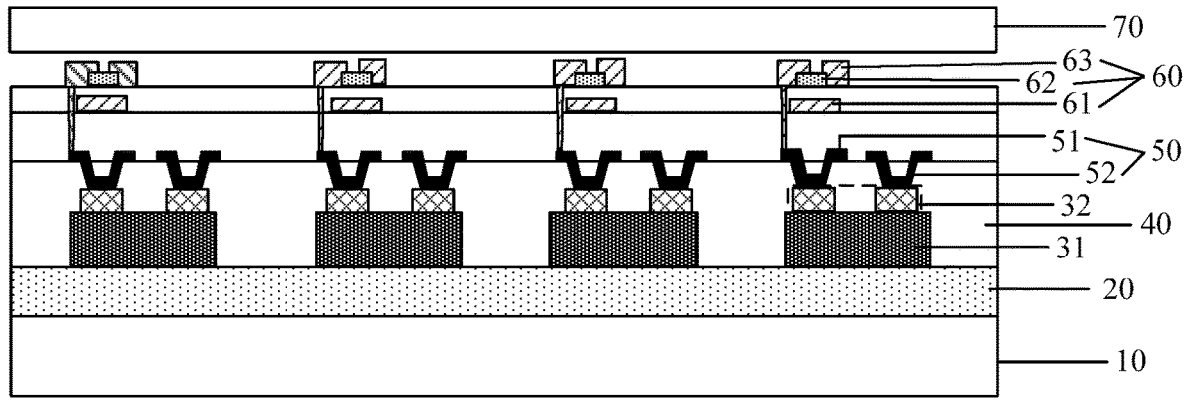
Figure 17:
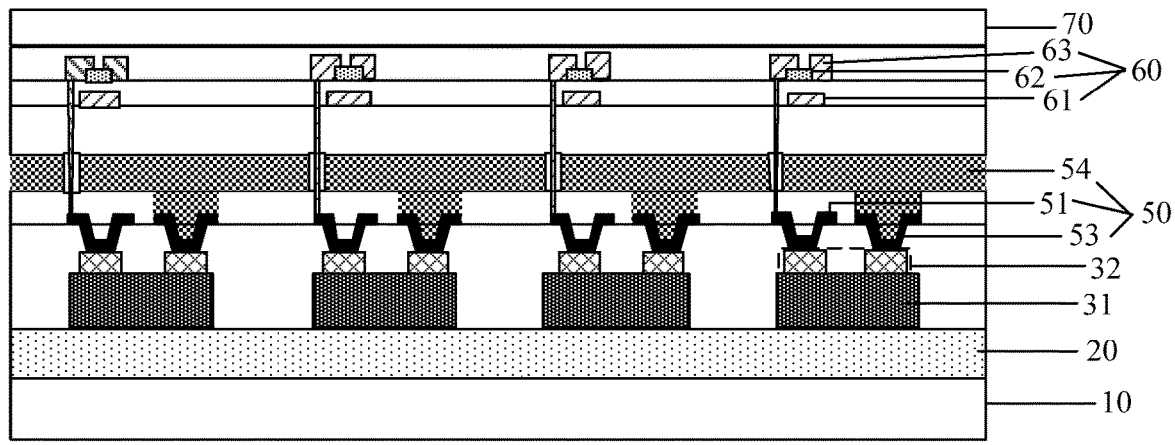

Based on any one of the embodiments described above, in an embodiment of the present disclosure, the manufacturing method further includes: as shown in FIGS. 16 and 17, forming a second substrate 70 on a side of the control circuit facing away from the electrode structure 50. The second substrate 70 is used as an upper substrate of the display panel and is configured to protect an internal structure of the display panel.

In the method for manufacturing the display panel according to the embodiment of the present disclosure, the display panel is formed by sequentially forming the buffer layer and the LED structure on a side of the first substrate without a transport process, thereby decreasing the complexity of the manufacturing process of the display panel.

In addition, the transport process is not required in the method for manufacturing the display panel according to the embodiment of the present disclosure, in this way, it is not required a high-precision alignment device for ensuring that the LED structure is strictly aligned with an opening region on the array substrate in the transport process, which decreases a cost of the display panel and avoids damage to the LED structure during the transport process, thereby solving a problem of possible failure of the LED structure due to the transport process.

In addition, in the method for manufacturing the display panel according to the embodiment of the present disclosure, the LED structure is first manufactured, then the electrode structure electrically connected to the LED structure and the control circuit electrically connected to the electrode structure are directly manufactured on the side of the LED structure facing away from the first substrate without a high-temperature bonding process, thereby preventing operation characteristics of a thin film transistor in the control circuit from varying due to influence of a high temperature.

In addition, in the display panel manufactured with the method according to the embodiment of the present disclosure, the first substrate and the first buffer layer are of low costs and easy to be formed to large sizes. Therefore, the method for manufacturing the display panel according to the embodiments of the present disclosure is not only suitable for manufacturing small and low-cost display panels, but also suitable for manufacturing large and low-cost display panels.

In addition, in the display panel manufactured with the method according to the embodiment of the present disclosure, the control circuit is located on a side of the LED structure facing away from the first substrate, and the control circuit and the LED structure are not arranged in a direction parallel to a plane where the display panel locates, thus it is not required to occupy non-opening regions in sub-pixels of the display panel, thereby increasing a resolution of the display panel in a case of the same display area.

In addition, in the display panel manufactured with the method according to the embodiment of the present disclosure, the control circuit is located on a side of the LED structure facing away from the first substrate, and the control circuit and the LED structure are not arranged in a direction parallel to a plane where the display panel locates. In this case, there may be not only more free space to arrange the control circuit, but also enough space to arrange other circuits, such as compensation circuits, to improve the display quality of the display panel.

It should be noted that with the development of the display technology, there are more and more application scenarios of the display panel, and different application scenarios have different demands on a display screen presented by the display panel. For example, the display panel requires to present a black and white image in some scenarios, while the display panel requires to present a color image in other scenarios.

A case that the display panel manufactured with the method according to the embodiments of the present disclosure is used for presenting the color image is taken as an example to illustrate the disclosure in conjunction with specific embodiments.

In one embodiment, in an embodiment of the present disclosure, the LED structure includes a first LED structure 31. The first LED structure 31 includes multiple LED units. The multiple LED units of the first LED structure 31 have the same color. In the embodiment of the present disclosure, in a case that the display panel requires to present the color image, the method for manufacturing the display panel further includes: providing a color conversion layer configured to convert light of the same color emitted by the multiple LED units of the first LED structure 31 to light of different colors to form the color image.

It should be noted that in an embodiment of the present disclosure, the display panel manufactured with the method according to the embodiments of the present disclosure may be a top emission display panel, that is, the light emitted by the display panel is emitted from a side of the second substrate 70 of the display panel facing away from the first substrate 10, and a display screen of the display panel is displayed on a side where the second substrate 70 is located. In another embodiment of the present disclosure, the display panel may also be a bottom emission display panel, that is, the light emitted by the display panel is emitted from a side of the first substrate 10 facing away from the second substrate 70, and a display screen of the display panel is displayed on a side where the first substrate 10 is located.

In one embodiment, in a case that the display panel is the top emission display panel, in an embodiment of the present disclosure, the color conversion layer 80 may be located between the control circuit and the second substrate 70, or located on a side of the second substrate 70 facing away from the control circuit, which is not limited in the present disclosure.

Figure 18:
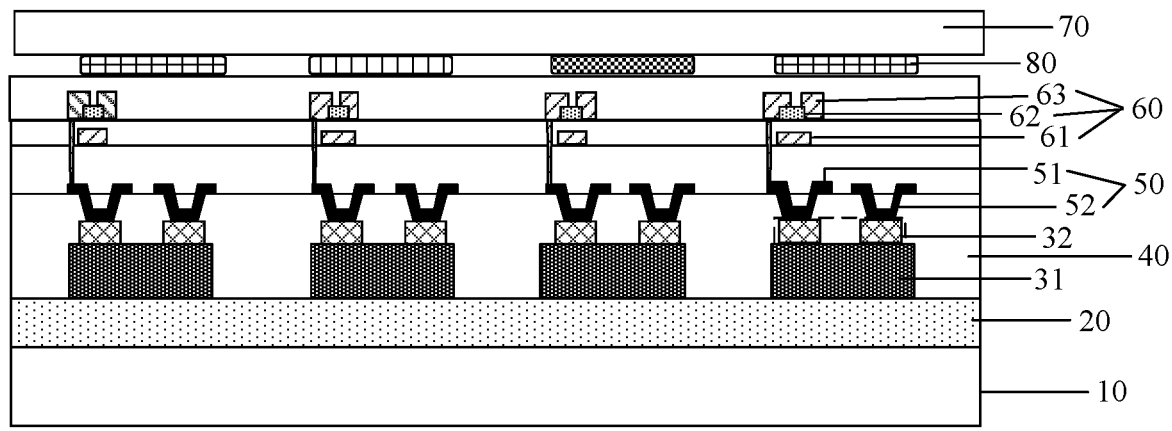

In a case that the color conversion layer is located between the control circuit and the second substrate, as shown in FIG. 18, the method further includes: forming the color conversion layer 80 on a side of the control circuit facing away from the first substrate 10, and attaching the second substrate 70 to a side of the color conversion layer 80 facing away from the first substrate 10.

In a case that the color conversion layer is located on a side of the second substrate 70 close to the control circuit, the method further includes: forming a color conversion layer 80 on a first side of the second substrate 70, attaching the second substrate 70 to a side of the control circuit facing away from the first substrate 10, where the color conversion layer 80 is located on a side of the second substrate 70 facing towards the first substrate 10.

Figure 19:
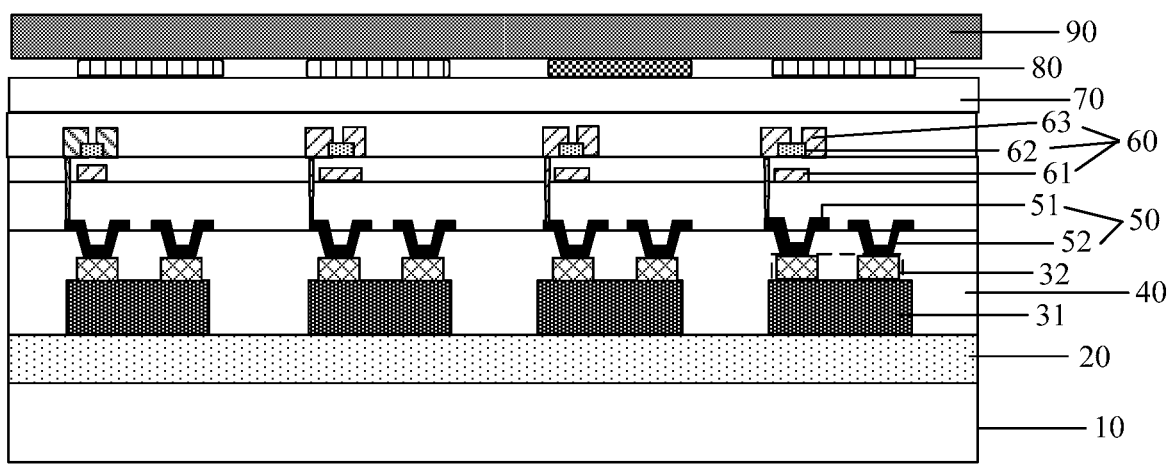

In other embodiments of the present disclosure, in a case that the color conversion layer is located on the side of the second substrate 70 facing away from the control circuit, as shown in FIG. 19, the method further includes: forming the color conversion layer 80 on the side of the second substrate 70 facing away from the control circuit, and forming a protection structure 90 covering the color conversion layer 80 on a side of the color conversion layer 80 facing away from the second substrate 70.

In another embodiment of the present disclosure, in a case that the color conversion layer is located on a side of the second substrate 70 facing away from the control circuit, the method further includes: forming the color conversion layer on the protection structure, attaching the protection structure provided with the color conversion layer to a side of the second substrate facing away from the control circuit, where the color conversion layer is located between the second substrate and the protection structure.

Figure 20:
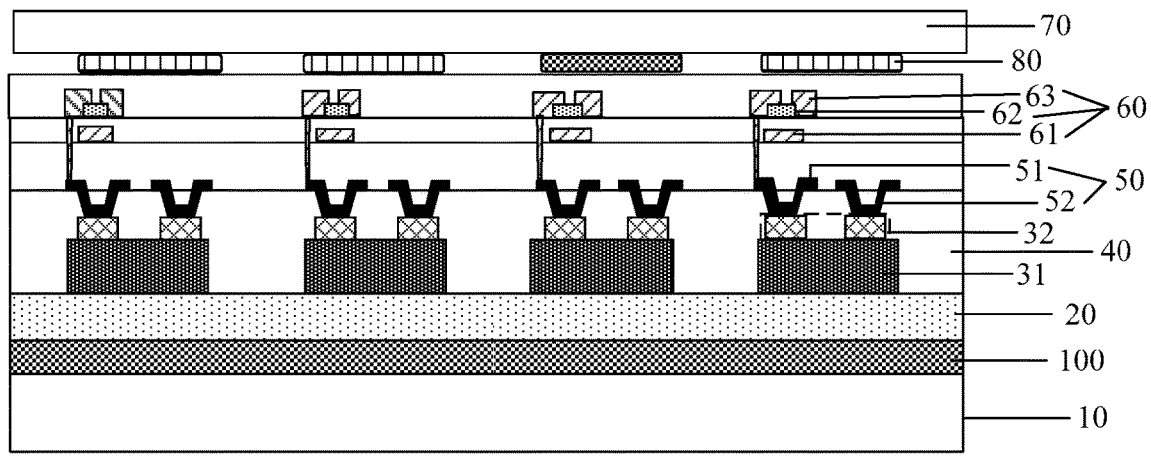

It should be noted that in the embodiments described above, in operation of the display panel, the light emitted by the LED structure is not only directed to the side where the second substrate 70 is located, but also directed to the side where the first substrate 10 is located. In order to increase the light utilization efficiency of the display panel and make that the light emitted by the LED structure is directed to the side where the second substrate 70 is located as much as possible, in an embodiment of the present disclosure, as shown in FIG. 20, the method further includes: forming a metal layer 100 on the first side of the first substrate 10 before the buffer layer 20 is formed on the first side of the first substrate 10; and forming the buffer layer 20 on a side of the metal layer 100 facing away from the first substrate 10. In this way, the metal layer 100 is used as a reflective layer of the display panel to reflect the light, emitted by the LED structure and directed to the side where the first substrate 10 is located, back to the second substrate 70, and the reflected light irradiates the outside from the second substrate 70.

In one embodiment, in the embodiment of the present disclosure, the metal layer may be a silver layer, an aluminum layer or other metal layers with high reflectivity, which is not limited in the present disclosure, as long as it may be ensured that the reflective layer is capable of reflecting the light emitted by the LED structure and directed to the side where the first substrate 10 is located back to the side where the second substrate 70 is located.

Figure 21:
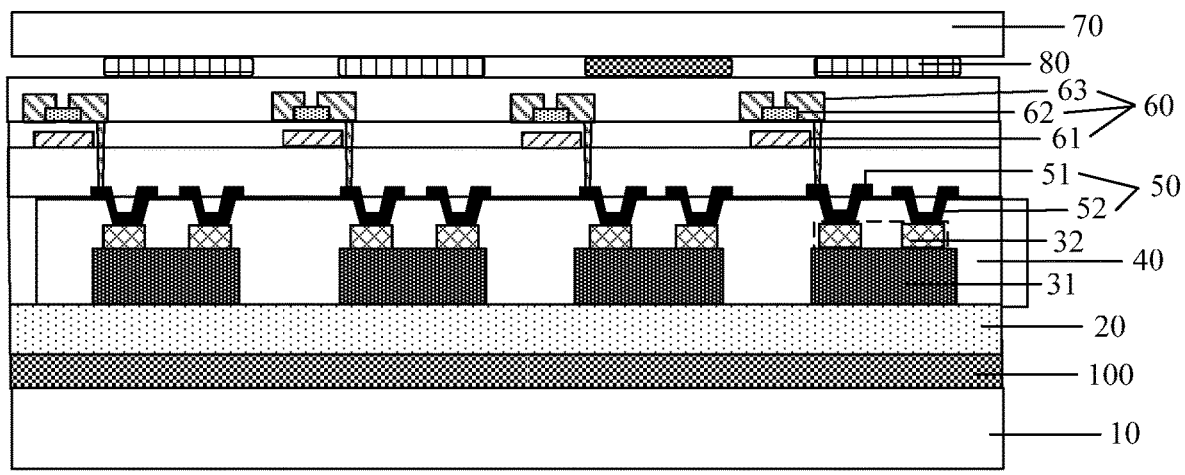

In a case that the display panel is the top emission display panel, in an embodiment of the present disclosure, as shown in FIG. 21, an orthographic projection of the control circuit on the first substrate 10 does not overlap an orthographic projection of the LED structure on the first substrate 10, so as to reduce impact of the control circuit on a light transmittance of the display panel and increase the light emitting efficiency of the display panel.

Based on any one of the embodiments described above, in an embodiment of the present disclosure, the electrode structure 50 is made of a transparent conductive material, such as Indium Tin Oxide (ITO), to reduce the impact of the electrode structure 50 on the light transmittance of the display panel.

A case that the display panel is the bottom emission display panel is described below.

In a case that the display panel is the bottom emission display panel, in an embodiment of the present disclosure, the color conversion layer 80 is located on a side of the first substrate 10 facing away from the buffer layer 20, in another embodiment, the color conversion layer 80 is located between the first substrate 10 and the buffer layer 20.

Figure 22:
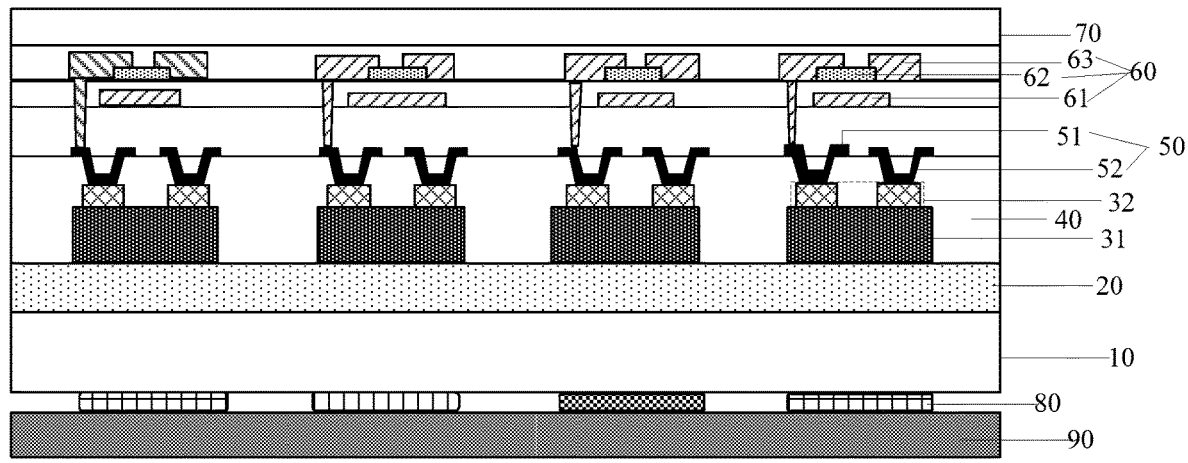

In a case that the color conversion layer 80 is located on the side of the first substrate 10 facing away from the buffer layer, in an embodiment of the present disclosure, as shown in FIG. 22, the method further includes: forming the color conversion layer 80 on the side of the first substrate 10 facing away from the buffer layer; and forming the protection structure 90 covering the color conversion layer 80 on a side of the color conversion layer 80 facing away from the first substrate 10.

In another embodiment of the present disclosure, the method further includes: forming the color conversion layer 80 on the protection structure 90, and attaching the protection structure 90 provided with the color conversion layer 80 to the side of the first substrate 10 facing away from the buffer layer, where the color conversion layer 80 is located between the first substrate 10 and the protection structure 90.

Figure 23:
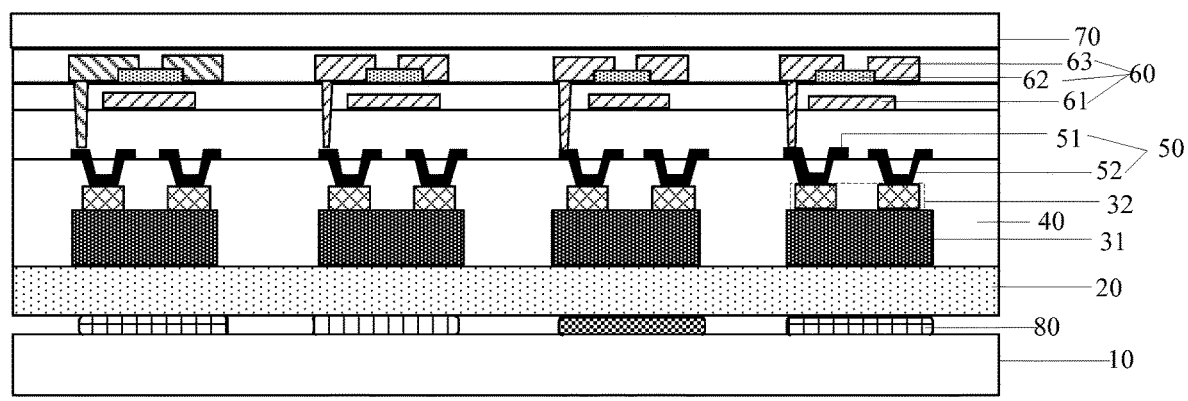

In a case that the color conversion layer 80 is located between the first substrate 10 and the buffer layer, in an embodiment of the present disclosure, as shown in FIG. 23, the method further includes: forming the color conversion layer 80 between the first substrate 10 and the buffer layer 20. In one embodiment, the method includes: forming a color conversion layer 80 on the first side of the first substrate 10 before the buffer layer 20 is formed on the first side of the first substrate 10; and forming the buffer layer 20 on a side of the color conversion layer 80 facing away from the first substrate 10.

It should be noted that in the embodiments described above, in operation of the display panel, the light emitted by the LED structure is not only directed to a side where the first substrate 10 is located, but also directed to a side where the second substrate 70 is located. In order to increase the light utilization efficiency of the display panel and make that the light emitted by the LED structure is directed to the side where the first substrate 10 is located as much as possible, in an embodiment of the present disclosure, the method further includes: forming a metal layer on the side of the LED structure facing away from the first substrate 10. The metal layer is used as a reflective layer of the display panel to reflect the light, emitted by the LED structure and directed to the side where the second substrate 70 is located, back to the first substrate 10, and the reflected light irradiates the outside from the first substrate 10.

In one embodiment, based on any one of the embodiments described above, in an embodiment of the present disclosure, the electrode structure 50 is made of a metal material so as to decrease a resistance of the electrode structure 50. In the embodiment of the present disclosure, the electrode structure may be formed by the deposition process.

Figure 24:
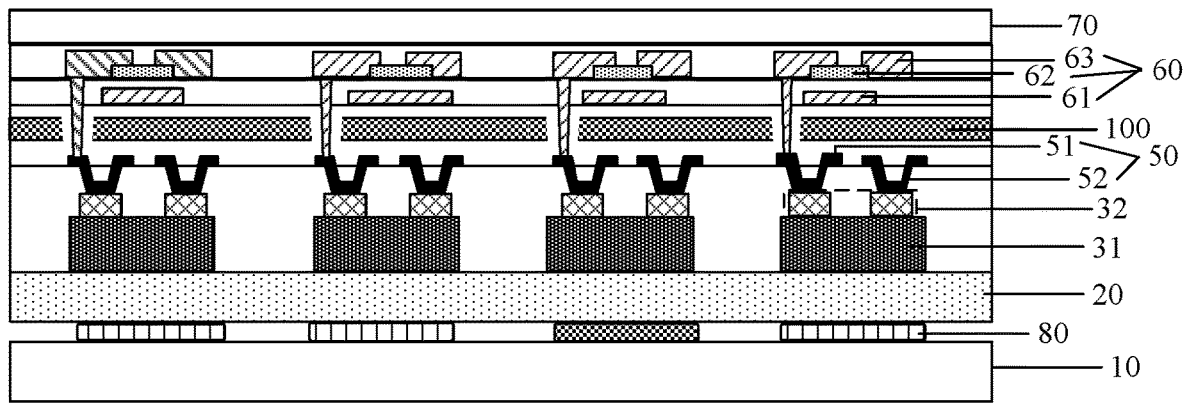

In the embodiments described above, in a case that the anode units and the cathode units are arranged in the same layer, as shown in FIG. 24, the method further includes:

forming a metal layer 100 on a side of the electrode structure 50 facing away from the LED structure. The metal layer 100 may be located between any two film layers between the LED structure and the second substrate 70, which is not limited in the present disclosure and depends on specific requirements.

Figure 25:
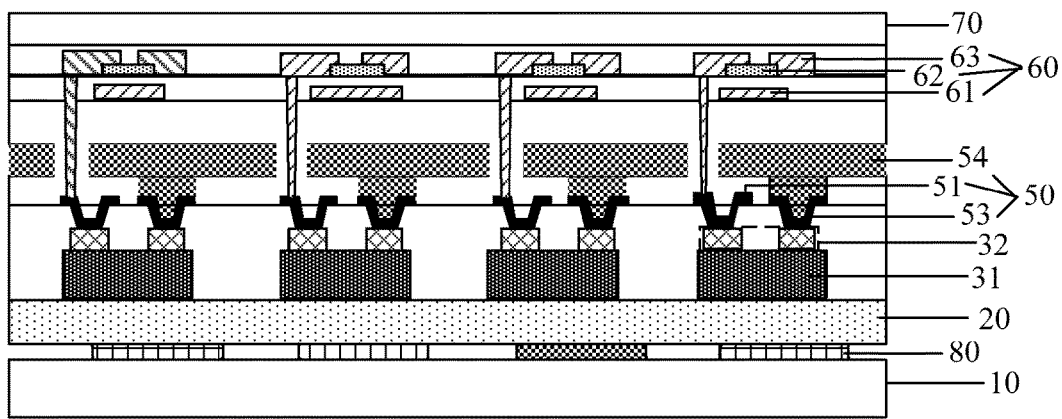

In a case that the anode unit and the cathode unit are arranged in different layers, as shown in FIG. 25, that is, the cathode structure includes the cathode layer 54 and the electrical connection structures 53, in this case, the cathode layer 54 may be a metal layer, thereby using the cathode layer 54 of the cathode structure as the reflective layer of the display panel so as to simplify the manufacturing process of the display panel on the basis of increasing the light utilization efficiency of the display panel.

It should be noted that in the embodiments described above, the display panel realizes display of the color image through the color conversion layer 80. In other embodiments of the present disclosure, the display panel may realize the display of the color image through the LED units having the different colors.

Figure 26:
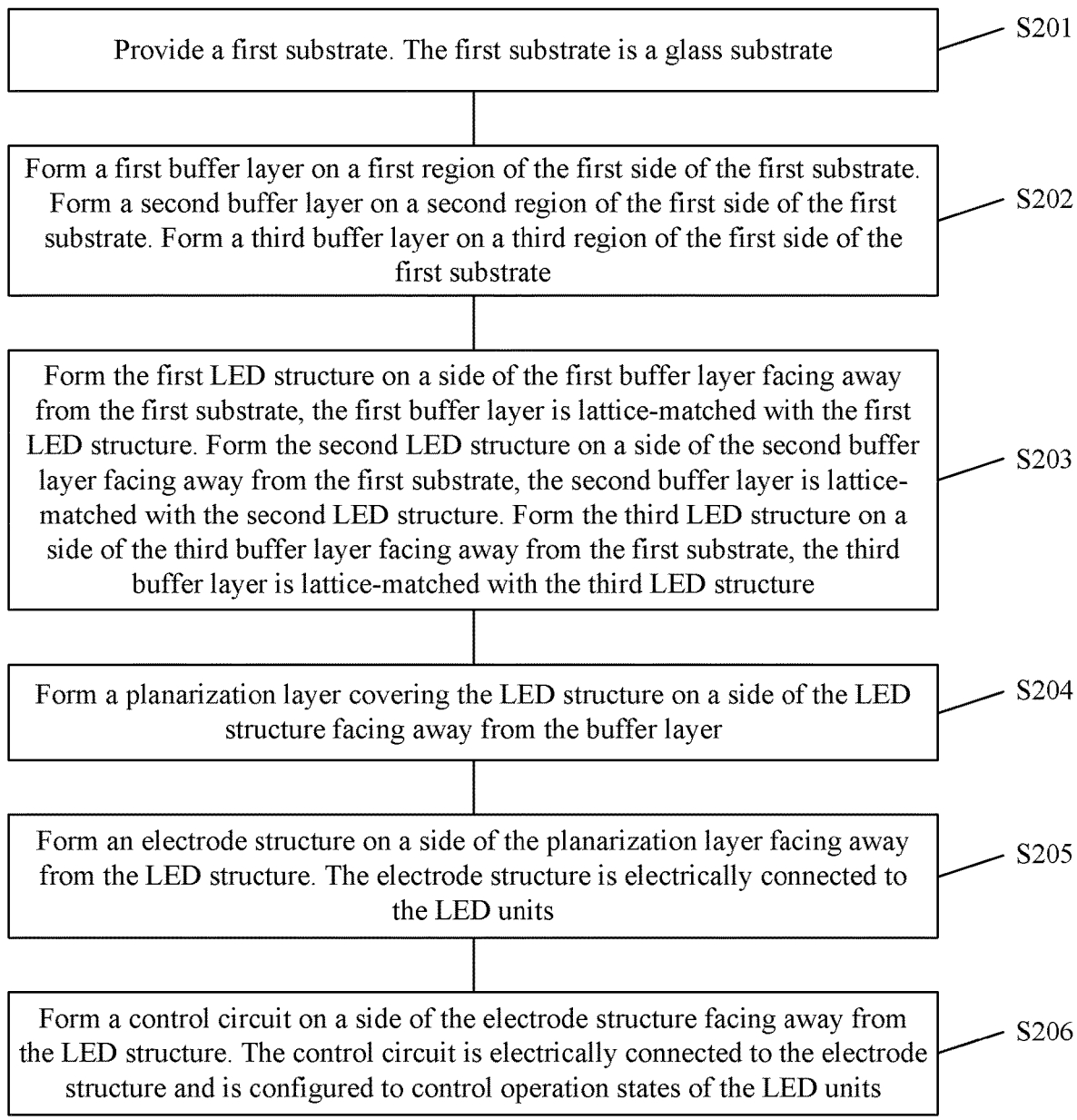
FIG. 26 is a flowchart of a method for manufacturing a display panel according to another embodiment of the present disclosure.

The method for manufacturing the display panel which realizes the display of the color image through the LED units having different colors is described below. As shown in FIG. 26, FIG. 26 is a flowchart of a method for manufacturing a display panel according to another embodiment of the present disclosure. Steps S201, S204, S205 and S206 are the same as steps S101, S104, S105 and S106 respectively, which are not repeated herein. Only steps S202 and S203 are described below.

In one embodiment, in a case that the display panel realizes the display of the color image through the LED units having different colors, the LED structure includes a first LED structure, a second LED structure and a third LED structure. The first LED structure includes multiple LED units, the multiple LED units of the first LED structure 31 have a first color. The second LED structure includes multiple LED units, the multiple LED units of the second LED structure have a second color. The third LED structure includes multiple LED units, the multiple LED units of the third LED structure have a third color. The first color, the second color and the third color are different from each other. In the embodiment of the present disclosure, the buffer layer includes at least one first buffer layer, at least one second buffer layer and at least one third buffer layer. The first buffer layer, the second buffer layer and the third buffer layer are arranged in the same layer.

In one embodiment, in the embodiment of the present disclosure, in step S202, a buffer layer is formed on a first side of the first substrate, the first substrate includes the at least one first buffer layer. Step S202 specifically includes: forming a first buffer layer on a first region of the first side of the first substrate; forming a second buffer layer on a second region of the first side of the first substrate; and forming a third buffer layer on a third region of the first side of the first substrate. The first region is a region where the first LED structure is to be formed, the second region is a region where the second LED structure is to be formed, the third region is a region where the third LED structure is to be formed. The first buffer layer, the second buffer layer and the third buffer layer are arranged in the same layer.

In step S203, a LED structure is formed on a side of the buffer layer facing away from the first substrate. The LED structure includes a first LED structure, and the first LED structure includes multiple LED units. The first buffer layer is lattice-matched with the first LED structure. Step S203 specifically includes: forming the first LED structure on a side of the first buffer layer facing away from the first substrate, where the first buffer layer is lattice-matched with the first LED structure; forming the second LED structure on a side of the second buffer layer facing away from the first substrate, where the second buffer layer is lattice-matched with the second LED structure; and forming the third LED structure on a side of the third buffer layer facing away from the first substrate, where the third buffer layer is lattice-matched with the third LED structure.

Based on the embodiments described above, in an embodiment of the present disclosure, the forming the buffer layer on a first side of the first substrate with the buffer layer including at least one first buffer layer further includes: forming a fourth buffer layer on the first region of the first side of the first substrate and forming the first buffer layer on a side of the fourth buffer layer facing away from the first substrate; forming a fifth buffer layer on the second region of the first side of the first substrate and forming the second buffer layer on a side of the fifth buffer layer facing away from the first substrate; and forming a sixth buffer layer on the third region of the first side of the first substrate and forming the third buffer layer on a side of the sixth buffer layer facing away from the first substrate. The first buffer layer, the second buffer layer and the third buffer layer are arranged in the same layer. The fourth buffer layer, the fifth buffer layer and the sixth buffer layer are arranged in the same layer.

It should be noted that in the embodiments described above, a lattice constant of the fourth buffer layer ranges from a lattice constant of the first buffer layer to a lattice constant of the first substrate, and a thermal expansion coefficient of the fourth buffer layer ranges from a thermal expansion coefficient of the first buffer layer to a thermal expansion coefficient of the first substrate so as to improve the growing quality of the first LED structure. A lattice constant of the fifth buffer layer ranges from a lattice constant of the second buffer layer to the lattice constant of the first substrate, and a thermal expansion coefficient of the fifth buffer layer ranges from a thermal expansion coefficient of the second buffer layer to the thermal expansion coefficient of the first substrate so as to improve the growing quality of the second LED structure. A lattice constant of the sixth buffer layer ranges from a lattice constant of the third buffer layer to the lattice constant of the first substrate, and a thermal expansion coefficient of the sixth buffer layer ranges from a thermal expansion coefficient of the third buffer layer to the thermal expansion coefficient of the first substrate so as to improve the growing quality of the third LED structure.

It should be further noted that in the embodiments described above, the buffer layer may also include multiple first buffer layers, multiple second buffer layers, multiple third buffer layers, multiple fourth buffer layers, multiple fifth buffer layers and multiple sixth buffer layers. The number of the first buffer layers, the number of the second buffer layers, the number of the third buffer layers, the number of the fourth buffer layers, the number of the fifth buffer layers and the number of the sixth buffer layers are the same. In a direction from the first substrate to the LED structure, the fourth buffer layers and the first buffer layers are arranged in an alternative manner, the fifth buffer layers and the second buffer layers are arranged in an alternative manner, and the sixth buffer layers and the third buffer layers are arranged in an alternative manner, so as to further improve the growing quality of the first LED structure, the growing quality of the second LED structure and the growing quality of the third LED structure.

Accordingly, a display panel is further provided according to embodiments of the present disclosure, as shown in FIG. 16, the display panel includes: a first substrate 10, a buffer layer 20, a LED structure, a planarization layer 40, an electrode structure 50 and a control circuit.

The first substrate 10 is a glass substrate. In one embodiment, the first substrate 10 is a high temperature resistant transparent substrate. A temperature can be withstood by the high temperature resistant glass substrate is more than 1000 degrees Celsius, so that the first substrate 10 is not damaged when subsequently growing the LED structure at a high temperature. More In one embodiment, the first substrate 10 is a quartz glass substrate.

The buffer layer 20 is located on a first side of the first substrate 10. The buffer layer 20 includes at least one first buffer layer.

The LED structure is located on a side of the buffer layer 20 facing away from the first substrate 10. The LED structure includes a first LED structure 31. The first LED structure 31 includes multiple LED units. The first buffer layer is lattice-matched with the first LED structure 31. In one embodiment, in an embodiment of the present disclosure, the LED structure is a Micro LED structure, which is not limited in the present disclosure and depends on specific requirements.

The planarization layer 40 covering the LED structure is located on a side of the LED structure facing away from the buffer layer 20. In one embodiment, the planarization layer 40 is an insulating layer, and a side of the planarization layer 40 facing away from the LED structure is provided with a flat surface.

The electrode structure 50 is located on a side of the planarization layer 40 facing away from the LED structure. The electrode structure 50 is electrically connected to the LED units. In one embodiment, the electrode structure 50 includes anode units 51 and cathode units 52. The anode unit 51 is electrically connected to a positive electrode terminal of the LED unit, and the cathode unit 52 is electrically connected to a negative electrode terminal of the LED unit.

The control circuit is located on a side of the electrode structure 50 facing away from the LED structure. The control circuit is electrically connected to the electrode structure 50 and is configured to control operation states of the LED units. The control circuit includes multiple scanning lines, multiple data lines and multiple thin film transistors 60. At least one thin film transistor 60 corresponds to one LED unit. Each thin film transistor 60 includes a gate 61, a channel structure 62 and a group 63 of source and drain.

Based on the embodiments described above, in an embodiment of the present disclosure, a thickness of the buffer layer 20 is more than 1 micron to avoid problems of poor relative density and large leakage current in the epitaxial LED structure on the buffer layer 20 due to excessively small thickness of the buffer layer 20.

In one embodiment, based on the embodiments described above, in an embodiment of the present disclosure, the buffer layer 20 includes one first buffer layer, in another embodiment of the present disclosure, the buffer layer 20 includes at least two first buffer layers, which is not limited in the present disclosure and depends on specific requirements.

Based on the embodiments described above, in an embodiment of the present disclosure, the first buffer layer being lattice-matched with the first LED structure includes: a difference between a lattice constant of the first buffer layer and a lattice constant of the first LED structure being within a first preset numerical range, and a difference between a thermal expansion coefficient of the first buffer layer and a thermal expansion coefficient of the first LED structure being within a second preset numerical range. The first buffer layer is lattice-matched with the first LED structure, so that the first LED structure may be directly grown on the first buffer layer.

In one embodiment, in an embodiment of the present disclosure, the first preset numerical range is 0-10%, the second preset numerical range is 0-10%. That is, the first buffer layer being lattice-matched with the first LED structure includes: the difference between the lattice constant of the first buffer layer and the lattice constant of the first LED structure ranging from 0 to 10%; and the difference between the thermal expansion coefficient of the first buffer layer and the thermal expansion coefficient of the first LED structures ranging from 0 to 10%, which are not limited in the present disclosure. In other embodiments of the present disclosure, the first preset numerical range and/or the second preset numerical range may also be other numerical ranges, and the first preset numerical range and the second preset numerical range may be the same or different from each other, which is not limited in the present disclosure and depends on specific requirements.

Based on the embodiments described above, in an embodiment of the present disclosure, the buffer layer further includes a fourth buffer layer located between a film layer where the first substrate 10 is located and a film layer where the first buffer layer is located. A lattice constant of the fourth buffer layer ranges from the lattice constant of the first buffer layer to a lattice constant of the first substrate 10. A thermal expansion coefficient of the fourth buffer layer 22 ranges from the thermal expansion coefficient of the first buffer layer to a thermal expansion coefficient of the first substrate 10. In this way, transition between the lattice constant of the first buffer layer and the lattice constant of the first substrate 10 is realized by using the lattice constant of the fourth buffer layer, and transition between the thermal expansion coefficient of the first buffer layer and the thermal expansion coefficient of the first substrate 10 is realized by using the thermal expansion coefficient of the fourth buffer layer 22. In this case, the quality of the buffer layer is improved, and the quality of the LED structure grown on the buffer layer is improved.

Based on the embodiments described above, in an embodiment of the present disclosure, as shown in FIG. 7, the buffer layer 20 includes one first buffer layer 21 and one fourth buffer layer 22. The fourth buffer layer 22 is located between the first substrate 10 and the first buffer layer 21. In another embodiment of the present disclosure, there are at least two first buffer layers and at least two fourth buffer layers, that is, the buffer layer includes at least two first buffer layers and at least two fourth buffer layers. In the embodiment of the present disclosure, the fourth buffer layers and the first buffer layers are arranged in an alternative manner. A film layer of the buffer layer that is in contact with the LED structure is the first buffer layer. In one embodiment, in an embodiment of the present disclosure, the buffer layer includes two first buffer layers and two fourth buffer layers, or the buffer layer includes three first buffer layers and three fourth buffer layers, which depend on specific requirements.

In one embodiment, based on the embodiments described above, in an embodiment of the present disclosure, the multiple LED units included in the first LED structure 31 are red LED units, the first buffer layer is an AlGaAs layer, and the fourth buffer layer is a SiAlAs layer. In another embodiment of the present disclosure, the multiple LED units included in the first LED structure 31 are green LED units, the first buffer layer is an AlGaP layer, and the fourth buffer layer is a SiAlP layer. In another embodiment of the present disclosure, the multiple LED units included in the first LED structure 31 are blue LED units, the first buffer layer is an AlGaN layer, and the fourth buffer layer is a SiAlN layer.

It should be noted that in an embodiment of the present disclosure, the display panel may be a top emission display panel, that is, light emitted by the display panel irradiates the outside from a side of the second substrate 70 of the display panel facing away from the first substrate 10, and a display screen of the display panel is displayed on a side where the second substrate 70 is located. In another embodiment of the present disclosure, the display panel may also be a bottom emission display panel, that is, the light emitted by the display panel irradiates the outside from a side of the first substrate 10 facing away from the second substrate 70, and a display screen of the display panel is displayed on a side where the first substrate 10 is located. The display panel is described hereinafter in conjunction with different cases.

In a case that the display panel is the bottom emission display panel, the electrode structure 50 is made of a metal material so as to decrease a resistance of the electrode structure 50. The light emitted by the LED units and directed to a side of the LED structure facing away from the first substrate 10 is reflected by the electrode structure 50 to increase the light utilization efficiency of the display panel.

In one embodiment, based on the embodiments described above, in an embodiment of the present disclosure, as shown in FIG. 16, the electrode structure 50 includes an anode structure and a cathode structure. The anode structure is electrically connected to the LED unit, the anode structure includes multiple anode units 51 electrically insulated from each other. The cathode structure is electrically connected to the LED units, the cathode structure includes multiple cathode units 52 electrically insulated from the multiple anode units 51. The cathode units and the anode units are arranged in the same layer. In one embodiment, the multiple anode units 51 are electrically insulated from each other. The anode unit 51 is electrically connected to the positive electrode terminal of the LED unit, the cathode unit 52 is electrically connected to the negative electrode terminal of the LED unit.

Based on the embodiments described above, in order to increase the light utilization efficiency of the display panel, as shown in FIG. 24, the display panel further includes a metal layer 100 located on a side of the LED structure facing away from the first substrate 10. The light emitted by the LED units and directed to a side of the LED structure facing away from the first substrate 10 is reflected by the metal layer 100, so as to increase the light utilization efficiency of the display panel. It should be noted that since the metal layer has good heat dissipation efficiency, in the embodiment of the present disclosure, the metal layer 100 may also improve the heat dissipation performance of the display panel.

In another embodiment of the present disclosure, the electrode structure 50 includes the anode units and the cathode structure arranged in different layers. The anode unit is electrically connected to a positive electrode terminal of the LED unit, and the cathode structure is electrically connected to negative electrode terminals of the LED units. It should be noted that in the embodiment of the present disclosure, the cathode units corresponding to the multiple LED units are of the same cathode structure. In one embodiment, the electrode structure includes an anode structure and a cathode structure. The anode structure is electrically connected to the LED units and includes multiple anode units 51. The cathode structure is located on a side of the anode structure facing away from the LED units and includes a cathode layer 54 and multiple electrical connection structures 53. The cathode layer 54 is electrically connected to the electrical connection structures 53. The cathode layer 54 is electrically connected to different negative electrode terminals of the LED units via different electrical connection structures 53.

Based on the embodiments described above, in order to increase the light utilization efficiency of the display panel, as shown in FIG. 25, the cathode layer in the cathode structure is a metal layer, the metal layer is also used as the reflective layer of the display panel. The light emitted by the LED units and directed to a side of the LED structure facing away from the first substrate 10 is reflected by the metal layer to increase the light utilization efficiency of the display panel. Also, the metal layers may also improve the heat dissipation performance of the display panel.

With the development of the display technology, there are more and more application scenarios of the display panel, and different application scenarios have different demands on a display screen presented by the display panel. For example, the display panel requires to present a black and white image in some scenarios, while the display panel requires to present a color image in other scenarios.

In a case that the display panel requires to present the color image and the multiple LED units included in the first LED structure 31 have the same color, based on any one of the embodiments described above, in an embodiment of the present disclosure, as shown in FIG. 22, the display panel further includes: a color conversion layer 80 located on a side of the first substrate 10 facing away from the first buffer layer; and a protection structure 90 covering a side of the color conversion layer 80 facing away from the first substrate 10. In another embodiment of the present disclosure, as shown in FIG. 23, the display panel further includes a color conversion layer 80 located between the first substrate 10 and the first buffer layer, so as to increase the light transmittance of the display panel, thereby increasing the light emitting efficiency of the display panel. The color conversion layer 80 is configured to convert light of the same color emitted by the multiple LED units corresponding to the first LED structure 31 to light of different colors to form the color image.

A case that the display panel is the bottom emission display panel is described above, and a case that the display panel is the top emission display panel is described below.

In an embodiment of the present disclosure, an orthographic projection of the control circuit on the first substrate 10 does not overlap an orthographic projection of the LED structure on the first substrate 10, so as to reduce the impact of the control circuit on the light transmittance of the display panel and increase the light emitting efficiency of the display panel.

Based on the embodiments described above, in an embodiment of the present disclosure, as shown in FIG. 20, the display panel further includes a metal layer 100 located between the first buffer layer and the first substrate 10. The metal layer 100 is used as the reflective layer of the display panel to reflect the light, emitted by the LED structure and directed to a side where the first substrate 10 is located, back to the second substrate 70. The reflected light irradiates the outside from a side where the second substrate 70 is located to increase the light utilization efficiency of the display panel.

In one embodiment, in the embodiment of the present disclosure, the metal layer may be a silver layer or an aluminum layer or other metal layers with high reflectivity, which is not limited in the present disclosure, as long as it may be ensured that the reflective layer can reflect the light, emitted by the LED structure and directed to the side where the first substrate 10 is located, back to the side where the second substrate 70 is located.

With the development of the display technology, there are more and more application scenarios of the display panel, and different application scenarios have different demands on a display screen presented by the display panel. For example, the display panel requires to present a black and white image in some scenarios, while the display panel requires to present a color image in other scenarios.

In a case that the display panel requires to present the color image and the multiple LED units included in the first LED structure 31 have the same color, based on any one of the embodiments described above, in an embodiment of the present disclosure, as shown in FIG. 20, the display panel further includes: a second substrate 70 located on a side of the control circuit facing away from the first substrate 10 and arranged opposite to the first substrate 10; and a color conversion layer 80 located between the second substrate 70 and the control circuit.

Based on any one of the embodiments described above, in an embodiment of the present disclosure, the electrode structure 50 is made of a transparent conductive material, such as ITO, to reduce the impact of the electrode structure 50 on the light transmittance of the display panel.

Based on the embodiments described above, in an embodiment of the present disclosure, as shown in FIG. 20, the electrode structure 50 includes multiple anode units 51 and multiple cathode units 52 arranged in the same layer. The multiple anode units 51 are electrically insulated from each other, the anode units 51 are electrically insulated from the cathode units 52. The anode unit 51 is electrically connected to the positive electrode terminal of the LED unit, and the cathode unit 52 is electrically connected to the negative electrode terminal of the LED unit. In the embodiment of the present disclosure, the anode units 51 and the cathode units 52 are made of the transparent conductive materials.

In another embodiment of the present disclosure, as shown in FIG. 17, the electrode structure 50 includes an anode structure and a cathode structure. The anode structure is electrically connected to the LED units and includes multiple anode units 51. The cathode structure is located on a side of the anode structure facing away from the LED units and includes a cathode layer 54 and multiple electrical connection structures 53. The cathode layer 54 is electrically connected to the electrical connection structures 53. The cathode layer 54 is electrically connected to different LED units via different electrical connection structures 53. In the embodiment of the present disclosure, only the cathode layer 54 is made of a transparent conductive material, or all of the anode units 51, the cathode layer 54 and the electrical connection structures 53 are made of the transparent conductive material, which is not limited in the present disclosure and depends on specific requirements.

Based on any one of the embodiments described above, in an embodiment of the present disclosure, the color conversion layer 80 includes color resists of different colors. In another embodiment of the present disclosure, the color conversion layer 80 is a quantum dot element which includes multiple colors, which are not limited in the present disclosure, as long as the color conversion layer 80 is capable of converting the light of the same color emitted by the multiple LED units to the light of multiple colors.

It should be noted that in the embodiments described above, the display panel realizes display of the color image through the color conversion layer 80. In other embodiments of the present disclosure, the display panel realizes the display of the color image through the LED units having multiple colors instead of the color conversion layer 80.

In one embodiment, in a case that the display panel realizes the display of the color image through the LED units having multiple colors, the LED structure includes a first LED structure, a second LED structure and a third LED structure. The first LED structure includes multiple LED units having a first color. The second LED structure includes multiple LED units having a second color. The third LED structure includes multiple LED units having a third color. The first color, the second color and the third color are different from each other. Accordingly, in the embodiment of the present disclosure, the buffer layer includes at least one first buffer layer, at least one second buffer layer and at least one third buffer layer. The first buffer layer, the second buffer layer and the third buffer layer are arranged in the same layer. The first buffer layer is lattice-matched with the first LED structure, the second buffer layer is lattice-matched with the second LED structure, and the third buffer layer is lattice-matched with the third LED structure.

Based on the embodiments described above, in an embodiment of the present disclosure, the buffer layer further includes at least one fourth buffer layer, at least one fifth buffer layer and at least one sixth buffer layer. In a case that the buffer layer includes one fourth buffer layer, one fifth buffer layer and one sixth buffer layer, in this case, the fourth buffer layer is located between the first substrate and the first buffer layer, the fifth buffer layer is located between the first substrate and the second buffer layer, the sixth buffer layer is located between the first substrate and the third buffer layer. The first buffer layer, the second buffer layer and the third buffer layer are arranged in the same layer. The fourth buffer layer, the fifth buffer layer and the sixth buffer layer are arranged in the same layer.

It should be noted that in the embodiments described above, a lattice constant of the fourth buffer layer ranges from a lattice constant of the first buffer layer to a lattice constant of the first substrate, a thermal expansion coefficient of the fourth buffer layer ranges from a thermal expansion coefficient of the first buffer layer to a thermal expansion coefficient of the first substrate so as to improve the growing quality of the first LED structure. A lattice constant of the fifth buffer layer ranges from a lattice constant of the second buffer layer to the lattice constant of the first substrate, a thermal expansion coefficient of the fifth buffer layer ranges from a thermal expansion coefficient of the second buffer layer to the thermal expansion coefficient of the first substrate so as to improve growing quality of the second LED structure. A lattice constant of the sixth buffer layer ranges from a lattice constant of the third buffer layer to the lattice constant of the first substrate, a thermal expansion coefficient of the sixth buffer layer ranges from a thermal expansion coefficient of the third buffer layer to the thermal expansion coefficient of the first substrate so as to improve growing quality of the third LED structure.

It should be further noted that in the embodiments described above, the buffer layer may also include multiple first buffer layers, multiple second buffer layers, multiple third buffer layers, multiple fourth buffer layers, multiple fifth buffer layers and multiple sixth buffer layers. The number of the first buffer layers, the number of the second buffer layers, the number of the third buffer layers, the number of the fourth buffer layers, the number of the fifth buffer layers and the number of the sixth buffer layers are the same. In a direction from the first substrate 10 to the LED structure, the fourth buffer layers and the first buffer layers are arranged in an alternative manner, the fifth buffer layers and the second buffer layers are arranged in an alternative manner, and the sixth buffer layers and the third buffer layers are arranged in an alternative manner, so as to further improve the growing quality of the first LED structure, the growing quality of the second LED structure and the growing quality of the third LED structure.

In view of the above, in the display panel provided in the embodiments of the present disclosure, the LED structure is directly grown up on a side of the buffer layer facing away from the first substrate without transport process, thereby decreasing the complexity of the manufacturing process of the display panel.

In addition, the transport process is not required in the method for manufacturing the display panel according to the embodiment of the present disclosure, in this way, it is not required a high-precision alignment device for ensuring that the LED structure is strictly aligned with an opening region on an array substrate in the transport process, which decreases a cost of the display panel and avoids damage to the LED structure during the transport process, thereby solving a problem of possible failure of the LED structure due to the transport process.

In addition, in the display panel provided according to the embodiment of the present disclosure, the electrode structure and the control circuit are arranged at a side of the LED structure facing away from the first substrate. That is, in the manufacturing process, the LED structure is first manufactured, then the electrode structure electrically connected to the LED structure and the control circuit electrically connected to the electrode structure are directly manufactured on the side of the LED structure facing away from the first substrate without a high-temperature bonding process, thereby preventing operation characteristics of a thin film transistor in the control circuit from varying due to influence of a high temperature and thereby improving the stability of the display panel.

In addition, in the display panel according to the embodiment of the present disclosure, the first substrate and the first buffer layer are of low cost, and the size of the first substrate and the first buffer layer may be changed. Therefore, the display panel according to the embodiments of the present disclosure is not only suitable for small and low-cost display panels, but also suitable for large and low-cost display panels.

In addition, in the display panel provided according to the embodiment of the present disclosure, the control circuit is located on a side of the LED structure facing away from the first substrate, and is not arranged in parallel with the LED structure, thus it is not required to occupy non-opening regions in sub-pixels of the display panel, thereby increasing a resolution of the display panel in a case of the same display area.

In addition, in the display panel provided according to the embodiment of the present disclosure, the control circuit is located on a side of the LED structure facing away from the first substrate, and is not arranged in parallel with the LED structure. In this case, there may be not only more free space to arrange the control circuit, but also enough space to arrange other circuits, such as compensation circuits, to improve the display quality of the display panel.

The embodiments of the present disclosure are described in a progressive manner, and each embodiment places emphasis on the difference from other embodiments. Therefore, for the same or similar parts between the embodiments, one may refer to the description of other embodiments.

According to the above description of the disclosed embodiments, those skilled in the art can implement or practice the present disclosure. Many changes to these embodiments are apparent for those skilled in the art, and general principles defined herein may be implemented in other embodiments without departing from the spirit or scope of the present disclosure. Hence, the present disclosure is not limited to the embodiments disclosed herein, but is to conform to the widest scope in accordance with the principles and novel features disclosed herein.

The invention claimed is:

1. A display panel, comprising:
   a first substrate, wherein the first substrate is a glass substrate;
   a buffer layer located on a first side of the first substrate, wherein the buffer layer comprises at least one first buffer layer;
   a Light Emitting Diode (LED) structure located on a side of the buffer layer facing away from the first substrate, wherein the LED structure comprises a first LED structure, the first LED structure comprises a plurality of LED units, wherein the first buffer layer is lattice-matched with the first LED structure;
   a planarization layer covering the LED structure and located on a side of the LED structure facing away from the buffer layer;
   an electrode structure located on a side of the planarization layer facing away from the LED structure, wherein the electrode structure is electrically connected to the LED units;
   a control circuit located on a side of the electrode structure facing away from the LED structure, wherein the control circuit is electrically connected to the electrode structure and is configured to control operation states of the LED units;
   a second substrate located on a side of the control circuit facing away from the first substrate and arranged opposite to the first substrate; and
   a color conversion layer located between the second substrate and the control circuit.

2. The display panel according to claim 1, wherein the electrode structure is made of a metal material.

3. The display panel according to claim 1, wherein an orthographic projection of the control circuit on the first substrate does not overlap an orthographic projection of the LED structure on the first substrate.

4. The display panel according to claim 3, further comprising:
   a metal layer located between the first buffer layer and the first substrate.

5. The display panel according to claim 3, wherein the electrode structure is made of a transparent conductive material.

6. The display panel according to claim 3, wherein the electrode structure comprises:
   an anode structure electrically connected to the LED units, wherein the anode structure comprises a plurality of anode units; and
   a cathode structure located on a side of the anode structure facing away from the LED units, wherein the cathode structure comprises a cathode layer and electrical connection structures, the cathode layer is electrically connected to the electrical connection structures, the cathode layer is electrically connected to the LED units via the electrical connection structures, and the cathode layer is made of a transparent conductive material.

7. The display panel according to claim 1, wherein the electrode structure comprises:
   an anode structure electrically connected to the LED units, wherein the anode structure comprises a plurality of anode units electrically insulated from each other; and
   a cathode structure electrically connected to the LED units, wherein the cathode structure comprises a plurality of cathode units electrically insulated from the plurality of anode units; wherein
   the plurality of anode units and the plurality of cathode units are arranged in the same layer.

8. The display panel according to claim 1, wherein
   the color conversion layer comprises color resists of different colors; or the color conversion layer is a quantum dot element comprising a plurality of colors.

9. The display panel according to claim 1, wherein the plurality of LED units of the first LED structure have the same color.

10. A display panel, comprising:
a first substrate, wherein the first substrate is a glass substrate;
a buffer layer located on a first side of the first substrate, wherein the buffer layer comprises at least one first buffer layer;
a Light Emitting Diode (LED) structure located on a side of the buffer layer facing away from the first substrate, wherein the LED structure comprises a first LED structure, the first LED structure comprises a plurality of LED units, wherein the first buffer layer is lattice-matched with the first LED structure;
a planarization layer covering the LED structure and located on a side of the LED structure facing away from the buffer layer;
an electrode structure located on a side of the planarization layer facing away from the LED structure, wherein the electrode structure is electrically connected to the LED units; and
a control circuit located on a side of the electrode structure facing away from the LED structure, wherein the control circuit is electrically connected to the electrode structure and is configured to control operation states of the LED units, wherein the buffer layer further comprises at least one second buffer layer and at least one third buffer layer, wherein the first buffer layer, the second buffer layer and the third buffer layer are arranged in the same layer;
the LED structure further comprises a second LED structure and a third LED structure, wherein each of the second LED structure and the third LED structure comprises a plurality of LED units, the plurality of LED units of the first LED structure have a first color, the plurality of LED units of the second LED structure have a second color, the plurality of LED units of the third LED structure have a third color, and the first color, the second color and the third color are different from each other; and
the second buffer layer is lattice-matched with the second LED structure, and the third buffer layer is lattice-matched with the third LED structure.

11. The display panel according to claim 10, wherein the buffer layer further comprises a fourth buffer layer located between the first substrate and the first buffer layer; and
a lattice constant of the fourth buffer layer ranges from a lattice constant of the first buffer layer to a lattice constant of the first substrate, and a thermal expansion coefficient of the fourth buffer layer ranges from a thermal expansion coefficient of the first buffer layer to a thermal expansion coefficient of the first substrate.

\* \* \* \* \*